US012732169B2

(12) United States Patent

Hashimoto et al.

(10) Patent No.: US 12,732,169 B2

(45) Date of Patent: Sep. 8, 2026

(54) SEMICONDUCTOR MODULE

(71) Applicant: Mitsubishi Electric Corporation, Tokyo (JP)

(72) Inventors: Nobuo Hashimoto, Fukuoka (JP); Wataru Hayashi, Fukuoka (JP)

(73) Assignee: Mitsubishi Electric Corporation, Tokyo (JP)

( * ) Notice: Subject to any disclaimer, the term of this patent is extended or adjusted under 35 U.S.C. 154(b) by 31 days.

(21) Appl. No.: 18/810,273

(22) Filed: Aug. 20, 2024

(65) Prior Publication Data

US 2025/0119125 A1 Apr. 10, 2025

(30) Foreign Application Priority Data

Oct. 6, 2023 (JP) ................................ 2023-174537

(51) Int. Cl.

*H03K 17/567* (2006.01)
*H03K 3/356* (2006.01)
*H03K 19/0185* (2006.01)
*G11C 19/28* (2006.01)

(52) U.S. Cl.

CPC . *H03K 3/356121* (2013.01); *H03K 3/356191* (2013.01); *H03K 19/018521* (2013.01); *G11C 19/28* (2013.01)

(58) Field of Classification Search

CPC ...... H03K 17/51; H03K 17/56; H03K 17/567; H03K 17/60; H03K 17/687; H03K 17/6871; H03K 17/6872; H03K 17/6874; H03K 3/356121; H03K 3/356191; H03K 19/017509; H03K 19/018521; H03K 2217/0063; H03K 2217/0072; H02M 1/088; G11C 7/1036; G11C 19/28

See application file for complete search history.

(56) References Cited

U.S. PATENT DOCUMENTS 10,998,902 B2 * 5/2021 Kawahara ............ H03K 17/602
2019/0089351 A1 3/2019 Noguchi
2020/0403612 A1 * 12/2020 Kawahara ...... H03K 19/018507
2025/0104744 A1 * 3/2025 Hashimoto .......... G11C 7/1096

FOREIGN PATENT DOCUMENTS

JP 2019-057985 A 4/2019
JP 2020-205702 A 12/2020

* cited by examiner

*Primary Examiner* — Long Nguyen

(74) *Attorney, Agent, or Firm* — Studebaker Brackett PLLC

(57) ABSTRACT

A semiconductor module according to the present disclosure comprises a high potential side drive circuit and a low potential side drive circuit. The high potential side drive circuit includes: first reception terminals to receive a first data signal, an enable signal, and a first clock signal; a first shift register; and a first output terminal to output the first clock signal to the low potential side drive circuit as a second clock signal. The low potential side drive circuit includes: second reception terminals to receive a second data signal, the enable signal, and the second clock signal; a second shift register, and a second output terminal to output the second data signal held in a flip-flop of a last stage of the second shift register to the high potential side drive circuit as the first data signal.

5 Claims, 11 Drawing Sheets

D1OUT
D2OUT
D3OUT
VB
VS
VSS
120
16
18
20
N0
N1
HVMOS
WT2
DH1
DH2
DH3
LOW VOLTAGE SIDE SET VALUE HOLDING UNIT

FIG.5

| | | |
|---|---|---|
| UPPER ARM | DRIVING CAPABILITY | P1 |
| | OTHER 1 | P2 |
| LOWER ARM | DRIVING CAPABILITY | P3 |
| | OTHER 1 | P4 |
| ⋮ | ⋮ | ⋮ |
| | | P5 |

HIN
LIN
EN
CK
CKL
SI
SIL
WT1
WT2
T30
T31
T32
T33
T34
T35
T36
t
RECORD IN LOW VOLTAGE SIDE SET VALUE HOLDING UNIT
RECORD IN HIGH VOLTAGE SIDE SET VALUE HOLDING UNIT

HIN
LIN
EN
CK
CKL
SI
SIL
WT1
WT2
T40
T41
T42
T43
T44
T45
T46
t
RECORD IN LOW VOLTAGE SIDE
SET VALUE HOLDING UNIT
RECORD IN HIGH VOLTAGE SIDE
SET VALUE HOLDING UNIT

CK
P2
22
302
301
300
Qb
Db
Tb
P1
P5
SIL
CKL
PARASITIC CAPACITANCE C1
P11
P8
38
Qa
202
Da
Ta
201
200
P7
SI
D
Q
H
L

SEMICONDUCTOR MODULE

CROSS REFERENCE TO RELATED APPLICATIONS

This nonprovisional application is based on Japanese Patent Application No. 2023-174537 filed on Oct. 6, 2023 with the Japan Patent Office, the entire contents of which are hereby incorporated by reference.

BACKGROUND OF THE INVENTION

Field of the Invention

The present disclosure relates to a semiconductor module, and more specifically to a semiconductor module having incorporated therein a power transistor and a drive circuit to drive the power transistor.

Description of the Background Art

A known semiconductor module has a micro processing unit (MPU) incorporated therein and having a function to generate a pulse width modulation (PWM) signal to internally generate the PWM signal in response to a signal received from an external controller to control a switching device.

In order to be able to change the semiconductor module's operation characteristics, it is necessary to perform communication between the external controller and an internal controller, and externally receive data for the change and also receive a trigger signal that defines a timing for the change, and accordingly, a terminal is required therefor and the module cannot be miniaturized.

In this respect, Japanese Patent Application Laying-Open No. 2020-205702 discloses a semiconductor module capable of changing operation characteristics while being miniaturized.

Specifically, Japanese Patent Application Laying-Open No. 2020-205702 discloses the semiconductor module in a configuration in which two shift registers provided on high and low sides, respectively, are connected in series and a clock is shared to miniaturize the semiconductor module.

SUMMARY OF THE INVENTION

Meanwhile, when a clock line allowing the clock to be shared is connected by wire and thus given a parasitic capacitance, a delay based on the parasitic capacitance may cause erroneous taking of data. This results in failing to set a driving capability to a normal value.

The present disclosure overcomes the above issue and contemplates a semiconductor module capable of normally setting a driving capability.

One aspect of a semiconductor module of the present disclosure comprises: first and second switching elements connected in series between a first potential and a second potential lower than the first potential and operating in a complementary manner; a high potential side drive circuit including a first driver connected to a first gate of the first switching element and receiving an input of a first drive signal to be capable of adjusting an output to the first gate; and a low potential side drive circuit including a second driver connected to a second gate of the second switching element and receiving an input of a second drive signal to be capable of adjusting an output to the second gate. The high potential side drive circuit includes: first reception terminals to receive a first data signal, an enable signal, and a first clock signal, respectively; a first shift register composed of a plurality of cascaded flip-flops, the first data signal being recorded in the flip-flops in response to the first clock signal and the enable signal, whenever the data signal is recorded in the flip-flops, the data having been recorded in the flip-flops being shifted to adjacent flip-flops; a first set value holding unit operative in response to the enable signal to extract and record contents recorded in the plurality of flip-flops of the first shift register; a first decoder to render a current outputting capability of the first driver variable according to the recording of the first set value holding unit; and a first output terminal to output the first clock signal to the low potential side drive circuit as a second clock signal. The low potential side drive circuit includes: second reception terminals to receive a second data signal, the enable signal, and the second clock signal, respectively; a second shift register composed of a plurality of cascaded flip-flops, the second data signal being recorded in the flip-flops in response to the second clock signal and the enable signal, whenever the second data signal is recorded in the flip-flops, the data having been recorded in the flip-flops being shifted to adjacent flip-flops; a second set value holding unit operative in response to the enable signal to extract and record contents recorded in the plurality of flip-flops of the second shift register; a second decoder to render a current outputting capability of the second driver variable according to the recording of the second set value holding unit; and a second output terminal to output the second data signal that is held in a flipflop of a last stage of the second shift register to the high potential side drive circuit as the first data signal.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 5 is a diagram for illustrating setting information held by a controller (MCU) 2 according to the first embodiment.

DESCRIPTION OF THE PREFERRED EMBODIMENTS

Hereinafter, embodiments of the present disclosure will be described in detail with reference to the accompanying drawings. In the following, identical or equivalent components in the figures are identically denoted and will not be described redundantly in principle.

First Embodiment

Figure 1:
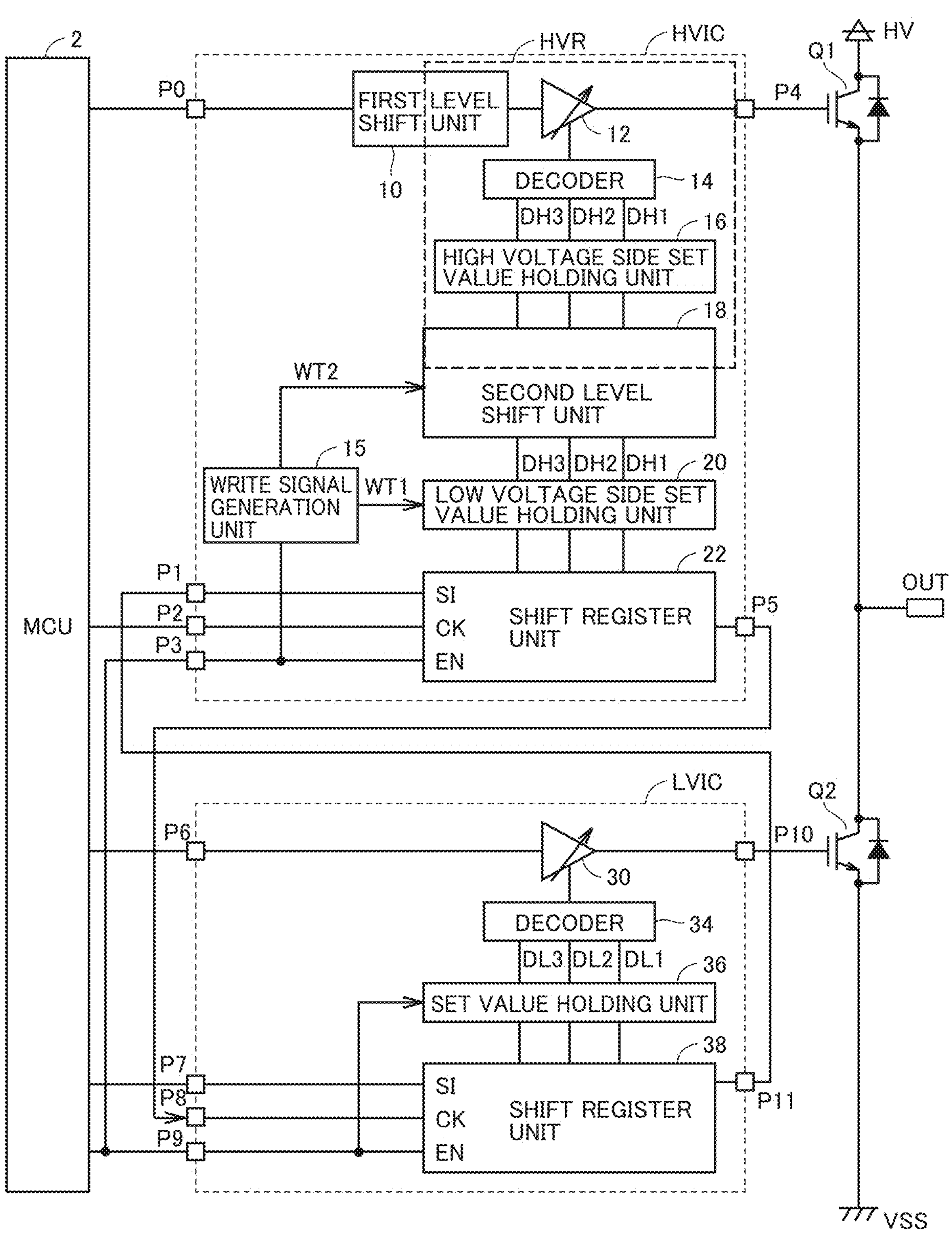
FIG. 1 is a diagram for generally illustrating a configuration of a semiconductor module according to a first embodiment.

FIG. 1 is a diagram for generally illustrating a configuration of a semiconductor module according to a first embodiment. Referring to FIG. 1, the semiconductor module comprises power transistors (switching elements) Q1 and Q2, and a drive circuit to drive gates of power transistors Q1 and Q2. Power transistor Q1 is provided between a high potential HV and an output node OUT. Power transistor Q2 is provided between output node OUT and a ground potential VSS. The drive circuit includes a high side output capability variable gate device HVIC (a high potential side drive circuit), and a low side output capability variable gate device LVIC (a low potential side drive circuit). High side output capability variable gate device HVIC is provided to correspond to the gate of power transistor Q1. Low side output capability variable gate device LVIC is provided to correspond to the gate of power transistor Q2. Power transistors Q1 and Q2 are operated complementarily by gate-driving by high side output capability variable gate device HVIC and low side output capability variable gate device LVIC. Output node OUT is connected to a motor or the like as a load, for example.

Controller (MCU) 2 outputs a data communication signal to high side output capability variable gate device HVIC and low side output capability variable gate device LVIC to drive power transistors Q1 and Q2. High side output capability variable gate device HVIC and low side output capability variable gate device LVIC drive power transistors Q1 and Q2, respectively, in accordance with the data communication signal received from controller 2. High side output capability variable gate device HVIC has input terminals P0 to P3 and output terminals P4 and P5. Input terminal P0 receives a high side drive signal HIN from controller 2. Input terminal P1 receives a data signal SIL from a shift register unit 38. Input terminal P2 receives a clock signal CK from controller 2. Input terminal P3 receives an enable signal EN from controller 2. Output terminal P4 is connected to the gate of power transistor Q1 and outputs high side drive signal HIN level-shifted to a high potential. Output terminal P5 is connected to an output terminal P8 and outputs clock signal CKL to shift register unit 38.

High side output capability variable gate device HVIC includes a first level shift unit 10 to level-shift the high side drive signal to a high potential, a shift register unit 22, a low voltage side set value holding unit 20, a second level shift unit 18, a high voltage side set value holding unit 16, a decoder 14, a driver 12, and a write signal generation unit 15.

Shift register unit 22 is composed of a plurality of cascaded DT flip-flops. Shift register unit 22 operates in accordance with data signal SIL, clock signal CK and enable signal EN to record an input data signal and move (or shift) the data signal to an adjacent DT flip-flop. In this example, a 3-bit data signal (DH1 to DH3) is held in shift register unit 22 and output to low voltage side set value holding unit 20.

Low voltage side set value holding unit 20 holds information that is held in shift register unit 22 in response to a write signal WT1.

Second level shift unit 18 level-shifts the data signal that is the 3-bit information held in low voltage side set value holding unit 20 to a high potential in response to enable signal EN.

High voltage side set value holding unit 16 holds information of the 3-bit data signal (DH1 to DH3) that is level-shifted by second level shift unit 18 in response to a write signal WT2.

Decoder 14 performs decoding based on the data signal (DH1 to DH3) held in high voltage side set value holding unit 16 and outputs the decoding to driver 12.

Write signal generation unit 15 generates write signals WT1 and WT2 in response to enable signal EN to hold a data signal in low voltage side set value holding unit 20 and high voltage side set value holding unit 16.

In this example, a high voltage region HVR is indicated, and a part of first and second level shift units 10 and 18, driver 12, decoder 14, and high voltage side set value holding unit 16 are provided in this region.

Low side output capability variable gate device LVIC has input terminals P6 to P9, and output terminals P10 and P11. Input terminal P6 receives a low side drive signal LIN from controller 2. Input terminal P7 receives a data signal SI from controller 2. Input terminal P8 is connected to output terminal P5 and receives clock signal CKL output from shift register unit 22. Input terminal P9 receives enable signal EN from controller 2. Output terminal P10 is connected to the gate of power transistor Q2 and outputs the low side drive signal. Output terminal P11 is connected to input terminal P1 and outputs data signal SIL to shift register unit 22.

Low side output capability variable gate device LVIC includes shift register unit 38, a set value holding unit 36, a decoder 34, and a driver 30.

Shift register unit 38 is composed of a plurality of cascaded DT flip-flops. Shift register unit 38 operates in accordance with the data signal, the clock signal and the enable signal to record an input data signal and move (or shift) the data signal to an adjacent DT flip-flop. In this example, a 3-bit data signal (DL1 to DL3) is held in shift register unit 38 and output to set value holding unit 36.

Set value holding unit 36 holds information that is held in shift register unit 38 in response to enable signal EN. Set value holding unit 36 holds the information that is held in shift register unit 38 in response to enable signal EN falling.

Decoder 34 performs decoding based on the data signal (DL1 to DL3) held in set value holding unit 36 and outputs the decoding to driver 30.

In this example, shift register units 22 and 38 are connected in series.

Figure 2:
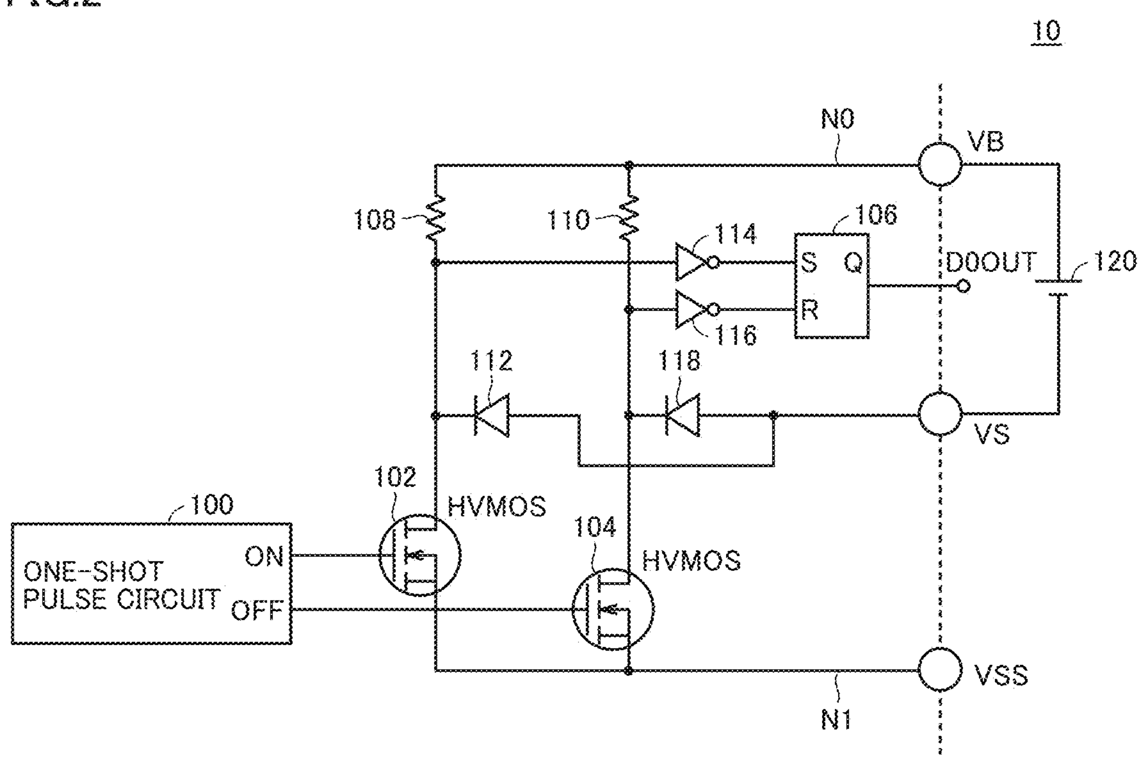
FIG. 2 is a diagram for illustrating a circuit configuration of a first level shift unit 10 according to the first embodiment.

FIG. 2 is a diagram for illustrating a circuit configuration of first level shift unit 10 according to the first embodiment. Referring to FIG. 2, first level shift unit 10 includes an on/off one-shot pulse circuit 100, high breakdown voltage MOS transistors 102 and 104, an SR flip-flop 106, inverters 114 and 116, diodes 112 and 118, and resistive elements 108 and 110.

On/off one-shot pulse circuit 100 outputs a one-shot pulse at a time of turning on/off (or when an input signal, or high side drive signal HIN, rises/falls). On/off one-shot pulse circuit 100 outputs a one-shot pulse to the gate of high breakdown voltage MOS transistor 102 at the time of turning on (or when the input signal rises). On/off one-shot pulse circuit 100 outputs a one-shot pulse to the gate of high breakdown voltage MOS transistor 104 at the time of turning off (or when the input signal, or high side drive signal HIN, falls). A Node NO is connected to a terminal VB. A floating power supply 120 is connected between terminal VB and a terminal VS. Terminal VSS, which is connected to a ground potential GND, is connected to a node N1. High breakdown voltage MOS transistors 102 and 104 are connected in parallel between node N0 and node N1. Resistive element 108 is provided between the source side of high breakdown voltage MOS transistor 102 and node N0. Resistive element 110 is provided between the source side of high breakdown voltage MOS transistor 104 and node N0. Diode 112 has an anode side connected to terminal VS, which will have an intermediate potential, and a cathode side connected to a connection node between resistive element 108 and high breakdown voltage MOS transistor 102. Diode 118 has an anode side connected to terminal VS that will have the intermediate potential, and a cathode side connected to a connection node between resistive element 110 and high breakdown voltage MOS transistor 104. Diodes 112 and 118 clamp a cathode voltage to falling from the voltage of terminal VS to the VF voltage of the diodes so as to avoid exceeding the breakdown voltages of inverters 114 and 116 and resistive elements 108 and 110.

When high breakdown voltage MOS transistor 102 is turned off, the potential of the connection node between resistive element 108 and high breakdown voltage MOS transistor 102 is set to a high potential. Accordingly, inverter 114 outputs a signal set to the "L" level. Similarly, when high breakdown voltage MOS transistor 104 is turned off, the potential of the connection node between resistive element 110 and high breakdown voltage MOS transistor 104 is set to a high potential. Accordingly, inverter 116 outputs a signal set to the "L" level.

When high breakdown voltage MOS transistor 102 is driven (or turned on), the potential of the connection node between resistive element 108 and high breakdown voltage MOS transistor 102 falls. Accordingly, inverter 114 outputs a signal set to the "H" level. Similarly, when high breakdown voltage MOS transistor 104 is driven (or turned on), the potential of the connection node between resistive element 110 and high breakdown voltage MOS transistor 104 falls. Accordingly, inverter 116 outputs a signal set to the "H" level.

On/off one-shot pulse circuit 100 outputs a one-shot pulse at the time of turning on (or when the input signal rises). This turns on high breakdown voltage MOS transistor 102. This pulls the connection node with resistive element 108 to the "L" level, and inverter 114 outputs the "H" level. That is, the RS flip-flop sets "1". On/off one-shot pulse circuit 100 outputs a one-shot pulse at the time of turning off (or when the input signal falls). This turns on high breakdown voltage MOS transistor 104. This pulls the connection node with resistive element 110 to the "L" level, and inverter 116 outputs the "H" level. That is, the RS flip-flop is reset to "0".

With this configuration, a drive signal input to on/off one-shot pulse circuit 100 is level-shifted to a high potential and held in RS flip-flop 106. RS flip-flop 106 outputs a held data signal from a terminal D0OUT.

Figure 3:
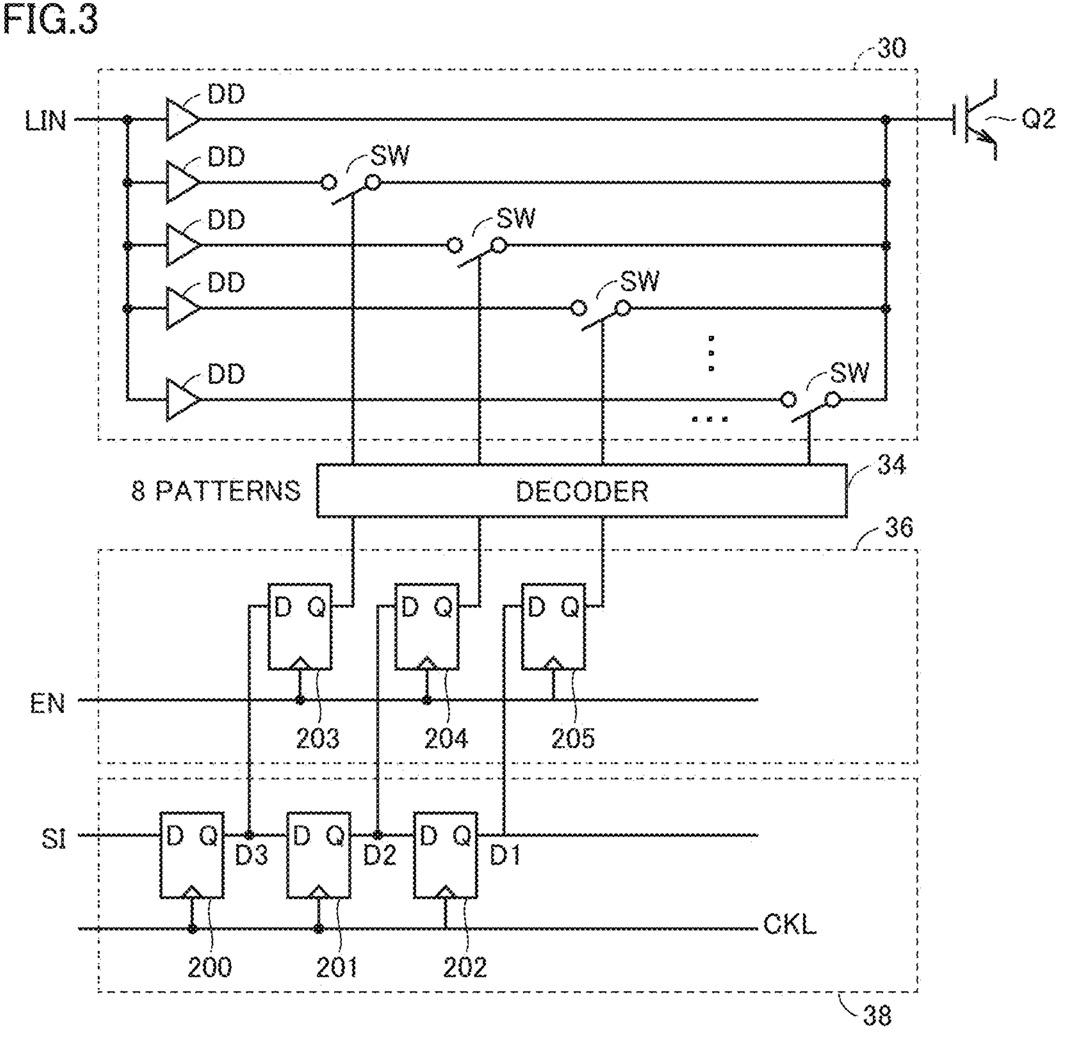
FIG. 3 is a diagram for illustrating a configuration of a driver 30 and a shift register unit 38 according to the first embodiment.

FIG. 3 is a diagram for illustrating a configuration of driver 30 and shift register unit 38 according to the first embodiment. Referring to FIG. 3, shift register unit 38 has a plurality of flip-flops (DT-FFs) 200 to 202 cascaded to configure a shift register. A data signal input from input terminal P7 is input to a D input of forefront flip-flop 200, and a Q output of forefront flip-flop 200 is input to a D input of flip-flop 201 of a subsequent stage. A Q output of flip-flop 201 of the subsequent stage is input to a D input of flip-flop 202 of a subsequent stage. Flip-flops 200 to 202 have their Q outputs output to set value holding unit 36 as data DL3, DL2, and DL1. Further, in this example, the Q output of flip-flop 202, which is in the last stage, is input as data signal SIL to terminal P1 of shift register unit 22 via terminal P11.

Clock signal CKL input from input terminal P8 is input to clock inputs of all flip-flops 200 to 202. A data signal input in response to clock signal CKL input is transmitted to a flip-flop of a subsequent stage and held in the flip-flop of the subsequent stage.

Set value holding unit 36 includes a plurality of flip-flops (DT-FFs) 203 to 205. Flip-flop 203 receives at a D input an output of flip-flop 200, or data DL3. Flip-flop 204 receives at a D input an output of flip-flop 201, or data DL2. Flip-flop 205 receives at a D input an output of flip-flop 202, or data DL1. An enable signal input from input terminal ENL is input to clock inputs of all flip-flops 203 to 205.

Thus, flip-flops 203 to 205 of set value holding unit 36 hold the Q outputs of flip-flops 200 to 202, or data DL3, DL2 and DL1, in response to enable signal EN received from input terminal P9, and output the data to decoder 34. Set value holding unit 36 holds 3-bit information (DL1 to DL3). Decoder 34 performs decoding based on the 3-bit information into an 8-pattern signal.

Driver 30 includes a plurality of drivers DDs connected in parallel to the gate of power transistor Q2. The plurality of drivers DDs except for one driver DD are all connected to the gate of power transistor Q2 via a switch SW, and switch SW is switched on/off to control connection to and disconnection from the gate of power transistor Q2. Switch SW is switched on/off as controlled by a set value, which is the Q outputs of flip-flops 200 to 202. Decoder 34 performs decoding based on the 3-bit information in set value holding unit 36 into the 8-pattern signal to control switching on/off switch SW.

Driver 30 has switch SW switched on in accordance with the 8-pattern signal output from decoder 34. When the number of switches SW of driver 30 is increased, the number of drivers DDs driving power transistor Q2 can be increased. This can increase the driving capability of driver 30. In this way, the driving capability can be set variably depending on the set value. While FIG. 3 illustrates the configuration of driver 30 of low side output capability variable gate device LVIC, the configuration of shift register unit 22 and driver 12 of high side output capability variable gate device HVIC is similarly discussed.

Figure 4:
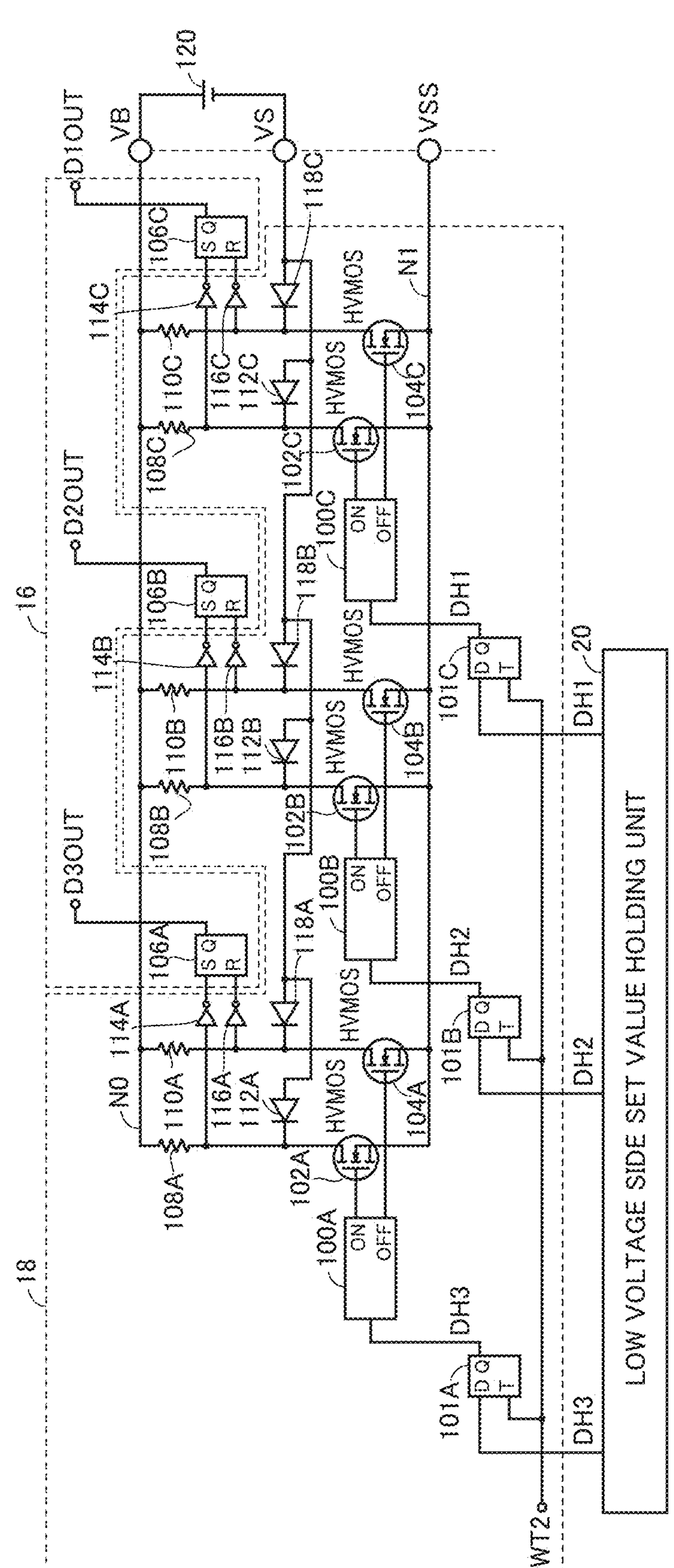
FIG. 4 is a diagram for illustrating a configuration of a high voltage side set value holding unit 16 and a second level shift unit 18 according to the first embodiment.

FIG. 4 is a diagram for illustrating a configuration of high voltage side set value holding unit 16 and second level shift unit 18 according to the first embodiment. Referring to FIG. 4, high voltage side set value holding unit 16 includes a plurality of flip-flops 106A to 106C.

Second level shift unit 18 includes a plurality of flip-flops (DT-FFs) 101A-101C, on/off one-shot pulse circuits 100A-100C, high breakdown voltage MOS transistors 102A-102C and 104A-104C, SR flip-flops 106A-106C, inverters 114A-114C and 116A-116C, diodes 112A-112C and 118A-118C, and resistive elements 108A-108C and 110A-110C.

Flip-flop 101A is triggered by write signal WT2 to hold data DH3 held in low voltage side set value holding unit 20. Flip-flop 101B is triggered by write signal WT2 to hold data DH2 held in low voltage side set value holding unit 20. Flip-flop 101C is triggered by write signal WT2 to hold data DH1 held in low voltage side set value holding unit 20.

On/off one-shot pulse circuit 100A outputs a one-shot pulse when data DH3 is turned on/off (or when an input signal rises/falls). On/off one-shot pulse circuit 100A outputs a one-shot pulse to the gate of high breakdown voltage MOS transistor 102A when the data is turned on (or when the input signal rises). On/off one-shot pulse circuit 100A outputs a one-shot pulse to the gate of high breakdown voltage MOS transistor 104A when the data is turned off (or when the input signal falls). Node NO is connected to terminal VB. Floating power supply 120 is connected between terminal VB and terminal VS. Terminal VSS connected to ground potential GND is connected to node N1. High breakdown voltage MOS transistors 102A and 104A are connected in parallel between node N0 and node N1. Resistive element 108A is provided between the source side of high breakdown voltage MOS transistor 102A and node N0. Resistive element 110A is provided between the source side of high breakdown voltage MOS transistor 104A and node N0. Diode 112A has an anode side connected to terminal VS, which will have an intermediate potential, and a cathode side connected to a connection node between resistive element 108A and high breakdown voltage MOS transistor 102A. Diode 118A has an anode side connected to terminal VS that will have the intermediate potential, and a cathode side connected to a connection node between resistive element 110A and high breakdown voltage MOS transistor 104A.

When high breakdown voltage MOS transistor 102A is turned off, the potential of the connection node between resistive element 108A and high breakdown voltage MOS transistor 102A is set to a high potential. Accordingly, inverter 114A outputs a signal set to the “L” level. Similarly, when high breakdown voltage MOS transistor 104A is turned off, the potential of the connection node between resistive element 110A and high breakdown voltage MOS transistor 104A is set to a high potential. Accordingly, inverter 116A outputs a signal set to the “L” level.

When high breakdown voltage MOS transistor 102A is driven (or turned on), the potential of the connection node between resistive element 108A and high breakdown voltage MOS transistor 102A falls. Accordingly, inverter 114A outputs a signal set to the “H” level. Similarly, when high breakdown voltage MOS transistor 104A is driven (or turned on), the potential of the connection node between resistive element 110A and high breakdown voltage MOS transistor 104A falls. Accordingly, inverter 116A outputs a signal set to the “H” level.

On/off one-shot pulse circuit 100A outputs a one-shot pulse when data DH3 is turned on (or when the input signal rises). This turns on high breakdown voltage MOS transistor 102A. This pulls the connection node with resistive element 108A to the “L” level, and inverter 114A outputs the “H” level. That is, the RS flip-flop sets “1”. On/off one-shot pulse circuit 100A outputs a one-shot pulse when data DH3 is turned off (or when the input signal falls). This turns on high breakdown voltage MOS transistor 104A. This pulls the connection node with resistive element 110A to the “L” level, and inverter 116A outputs the “H” level. That is, RS flip-flop 106A is reset to “0”.

With this configuration, data DH3 input to on/off one-shot pulse circuit 100A is level-shifted to a high potential and held in RS flip-flop 106A. RS flip-flop 106A outputs a held data signal from a terminal D3OUT.

On/off one-shot pulse circuit 100B outputs a one-shot pulse when data DH2 is turned on/off (or when an input signal rises/falls). On/off one-shot pulse circuit 100B outputs a one-shot pulse to the gate of high breakdown voltage MOS transistor 102B when the data is turned on (or when the input signal rises). On/off one-shot pulse circuit 100B outputs a one-shot pulse to the gate of high breakdown voltage MOS transistor 104B when the data is turned off (or when the input signal falls). Node NO is connected to terminal VB. Floating power supply 120 is connected between terminal VB and terminal VS. Terminal VSS connected to ground potential GND is connected to node N1. High breakdown voltage MOS transistors 102B and 104B are connected in parallel between node N0 and node N1. Resistive element 108B is provided between the source side of high breakdown voltage MOS transistor 102B and node N0. Resistive element 110B is provided between the source side of high breakdown voltage MOS transistor 104B and node N0. Diode 112B has an anode side connected to terminal VS that will have the intermediate potential, and a cathode side connected to a connection node between resistive element 108B and high breakdown voltage MOS transistor 102B. Diode 118B has an anode side connected to terminal VS that will have the intermediate potential, and a cathode side connected to a connection node between resistive element 110B and high breakdown voltage MOS transistor 104B.

When high breakdown voltage MOS transistor 102B is turned off, the potential of the connection node between resistive element 108B and high breakdown voltage MOS transistor 102B is set to a high potential. Accordingly, inverter 114B outputs a signal set to the “L” level. Similarly, when high breakdown voltage MOS transistor 104B is turned off, the potential of the connection node between resistive element 110B and high breakdown voltage MOS transistor 104B is set to a high potential. Accordingly, inverter 116B outputs a signal set to the “L” level.

When high breakdown voltage MOS transistor 102B is driven (or turned on), the potential of the connection node between resistive element 108B and high breakdown voltage MOS transistor 102B falls. Accordingly, inverter 114B outputs a signal set to the “H” level. Similarly, when high breakdown voltage MOS transistor 104B is driven (or turned on), the potential of the connection node between resistive element 110B and high breakdown voltage MOS transistor 104B falls. Accordingly, inverter 116B outputs a signal set to the “H” level.

On/off one-shot pulse circuit 100B outputs a one-shot pulse when data DH2 is turned on (or when the input signal rises). This turns on high breakdown voltage MOS transistor 102B. This pulls the connection node with resistive element 108B to the “L” level, and inverter 114B outputs the “H” level. That is, the RS flip-flop sets “1”. On/off one-shot pulse circuit 100B outputs a one-shot pulse when data DH2 is turned off (or when the input signal falls). This turns on high breakdown voltage MOS transistor 104B. This pulls the connection node with resistive element 110B to the “L” level, and inverter 116B outputs the “H” level. That is, the RS flip-flop is reset to “0”.

With this configuration, data DH2 input to on/off one-shot pulse circuit 100B is level-shifted to a high potential and held in RS flip-flop 106B. RS flip-flop 106B outputs a held data signal from a terminal D2OUT.

On/off one-shot pulse circuit 100C outputs a one-shot pulse when data DH1 is turned on/off (or when an input signal rises/falls). On/off one-shot pulse circuit 100C outputs a one-shot pulse to the gate of high breakdown voltage MOS transistor 102C when the data is turned on (or when the input signal rises). On/off one-shot pulse circuit 100C outputs a one-shot pulse to the gate of high breakdown voltage MOS transistor 104C when the data is turned off (or when the input signal falls). Node NO is connected to terminal VB. Floating power supply 120 is connected between terminal VB and terminal VS. Terminal VSS connected to ground potential GND is connected to node N1. High breakdown voltage MOS transistors 102C and 104C are connected in parallel between node N0 and node N1. Resistive element 108C is provided between the source side of high breakdown voltage MOS transistor 102C and node N0. Resistive element 110C is provided between the source side of high breakdown voltage MOS transistor 104C and node N0. Diode 112C has an anode side connected to terminal VS that will have the intermediate potential, and a cathode side connected to a connection node between resistive element 108C and high breakdown voltage MOS transistor 102C. Diode 118C has an anode side connected to terminal VS that will have the intermediate potential, and a cathode side connected to a connection node between resistive element 110C and high breakdown voltage MOS transistor 104C.

When high breakdown voltage MOS transistor 102C is turned off, the potential of the connection node between resistive element 108C and high breakdown voltage MOS transistor 102C is set to a high potential. Accordingly, inverter 114C outputs a signal set to the "L" level. Similarly, when high breakdown voltage MOS transistor 104C is turned off, the potential of the connection node between resistive element 110C and high breakdown voltage MOS transistor 104C is set to a high potential. Accordingly, inverter 116C outputs a signal set to the "L" level.

When high breakdown voltage MOS transistor 102C is driven (or turned on), the potential of the connection node between resistive element 108C and high breakdown voltage MOS transistor 102C falls. Accordingly, inverter 114C outputs a signal set to the "H" level. Similarly, when high breakdown voltage MOS transistor 104C is driven (or turned on), the potential of the connection node between resistive element 110C and high breakdown voltage MOS transistor 104C falls. Accordingly, inverter 116C outputs a signal set to the "H" level.

On/off one-shot pulse circuit 100C outputs a one-shot pulse when data DH1 is turned on (or when the input signal rises). This turns on high breakdown voltage MOS transistor 102C. This pulls the connection node with resistive element 108C to the "L" level, and inverter 114C outputs the "H" level. That is, the RS flip-flop sets "1". On/off one-shot pulse circuit 100C outputs a one-shot pulse when data DH1 is turned off (or when the input signal falls). This turns on high breakdown voltage MOS transistor 104C. This pulls the connection node with resistive element 110C to the "L" level, and inverter 116C outputs the "H" level. That is, the RS flip-flop is reset to "0".

With this configuration, data DH1 input to on/off one-shot pulse circuit 100C is level-shifted to a high potential and held in RS flip-flop 106C. RS flip-flop 106C outputs a held data signal from a terminal D1OUT.

FIG. 5 is a diagram for illustrating setting information held by controller (MCU) 2 according to the first embodiment. Referring to FIG. 5, a driving force table is provided in a memory of controller (MCU) 2. For example, a plurality of pieces of set value data defining a driving capability for the driver of high side output capability variable gate device HVIC (an upper gate) and that for the driver of low side output capability variable gate device LVIC (a lower gate) are stored.

In this example, data P1 and P2 for the driver on the side of an upper arm and data P3 and P4 for the driver on the side of a lower arm are stored as the set value data for the drivers' driving capabilities.

While in addition to the drivers' driving capabilities another capability is also specified, as indicated as "other 1" by way of example, the other capability is not identified in the present embodiment.

Controller 2 reads data using the driving force table, as necessary, and stores the data in shift register unit 22 of high side output capability variable gate device HVIC (or the upper gate) and shift register unit 38 of low side output capability variable gate device LVIC (or the lower gate).

This allows the driving capability of driver 12 and that of driver 30 to be variable.

Thus, the data signal (DH1 to DH3) held in low voltage side set value holding unit 20 is held in high voltage side set value holding unit 16 via second level shift unit 18. Decoder 14 converts the data signal into the 8-pattern signal, and thereafter the driving capability of driver 12 is changed.

Figure 6:
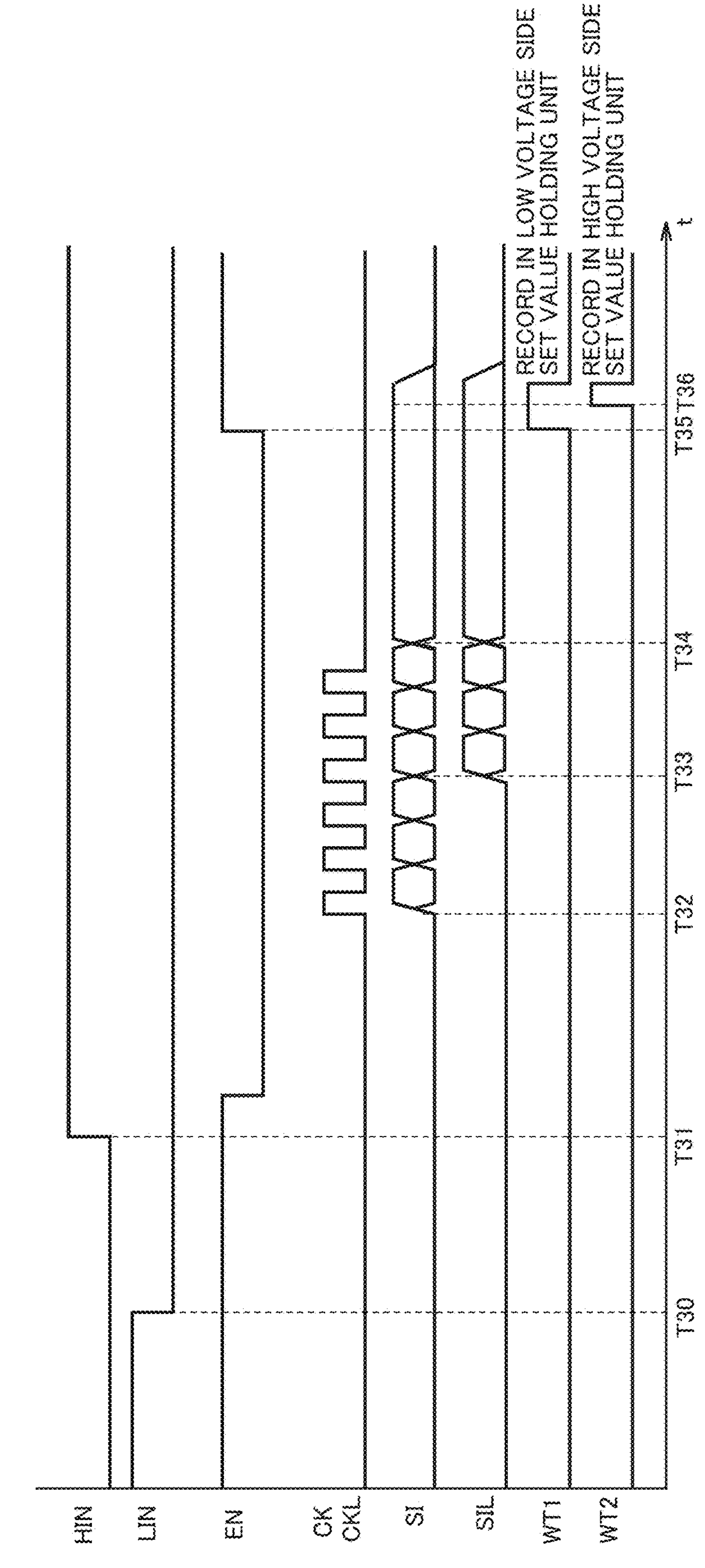
FIG. 6 is timing plots when setting a driving capability for the semiconductor module according to the first embodiment.

FIG. 6 is timing plots when setting a driving capability for the semiconductor module according to the first embodiment. Referring to FIG. 6, at time T30, low side drive signal LIN of input terminal P6 falls. Output terminal P10 outputs a gate signal of the "L" level and power transistor Q2 turns off.

At time T31, high side drive signal HIN of input terminal P0 rises complementarily. Output terminal P4 outputs a gate signal of the "H" level and power transistor Q1 turns on.

The present example indicates a case in which a driving capability is set after time T31, or at time T32. Specifically, at time T32, input terminal P2 receives clock signal CK. Further, input terminal P7 receives data signal SI. Clock signal CK is input from output terminal P5 to input terminal P8 as clock signal CKL.

Shift register unit 38 receives data signal SI from input terminal P7 and sequentially holds the data signal in the plurality of flip-flops in synchronization with clock signal CKL.

At time T33, an output of flip-flop 202 of shift register unit 38 is input as data signal SIL to input terminal P1 via output terminal P11. At time T34, shift register unit 22 holds data in three flip-flops.

Subsequently, at time T35, enable signal EN rises, and write signal generation unit 15 sets write signal WT1 to the "H" level in response to enable signal EN. Low voltage side set value holding unit 20 stores the data signal that is held in shift register unit 22 in response to write signal WT1. Subsequently, at time T36, write signal generation unit 15 sets write signal WT2 to the "H" level. The data signal (DH1 to DH3) held in low voltage side set value holding unit 20 is held in high voltage side set value holding unit 16 via second level shift unit 18 in response to write signal WT2 (of the "H" level). Decoder 14 converts the data signal into the 8-pattern signal, and thereafter the driving capability of driver 12 is changed.

Figure 7:
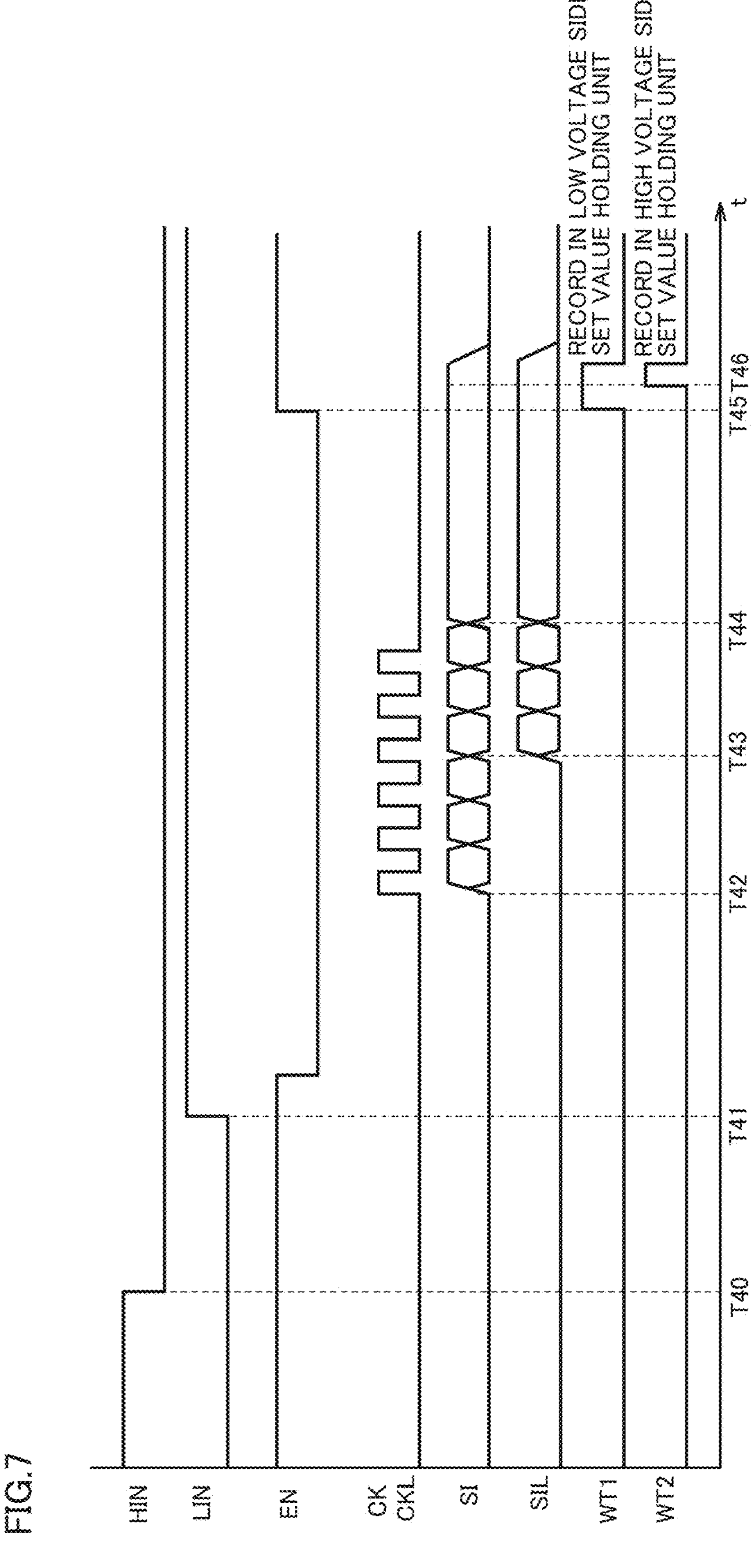
FIG. 7 is timing plots when setting a driving capability for the semiconductor module according to the first embodiment at another time.

FIG. 7 is timing plots when setting a driving capability for the semiconductor module according to the first embodiment at another time. Referring to FIG. 7, at time T40, high side drive signal HIN of input terminal P0 falls. Output terminal P4 outputs a gate signal of the "L" level and power transistor Q1 turns off.

At time T41, low side drive signal LIN of input terminal P6 rises complementarily. Output terminal P10 outputs a gate signal of the "H" level and power transistor Q2 turns on.

The present example indicates a case in which a driving capability is set after time T41, or at time T42. Specifically, at time T42, input terminal P2 receives clock signal CK. Further, input terminal P7 receives data signal SI. Clock signal CK is input from output terminal P5 to input terminal P8 as clock signal CKL.

Shift register unit 38 receives data signal SI from input terminal P7 and sequentially holds the data signal in the plurality of flip-flops in synchronization with clock signal CKL.

At time T43, an output of flip-flop 202 of shift register unit 38 is input as data signal SIL to input terminal P1 via output terminal P11. At time T44, shift register unit 22 holds data in three flip-flops.

Subsequently, at time T45, enable signal EN rises, and write signal generation unit 15 sets write signal WT1 to the "H" level in response to enable signal EN. Low voltage side set value holding unit 20 stores the data signal that is held in shift register unit 22 in response to write signal WT1. Subsequently, at time T46, write signal generation unit 15 sets write signal WT2 to the "H" level. The data signal (DH1 to DH3) held in low voltage side set value holding unit 20 is held in high voltage side set value holding unit 16 via second level shift unit 18 in response to write signal WT2 (of the "H" level). Decoder 14 converts the data signal into the 8-pattern signal, and thereafter the driving capability of driver 12 is changed.

Figure 8:
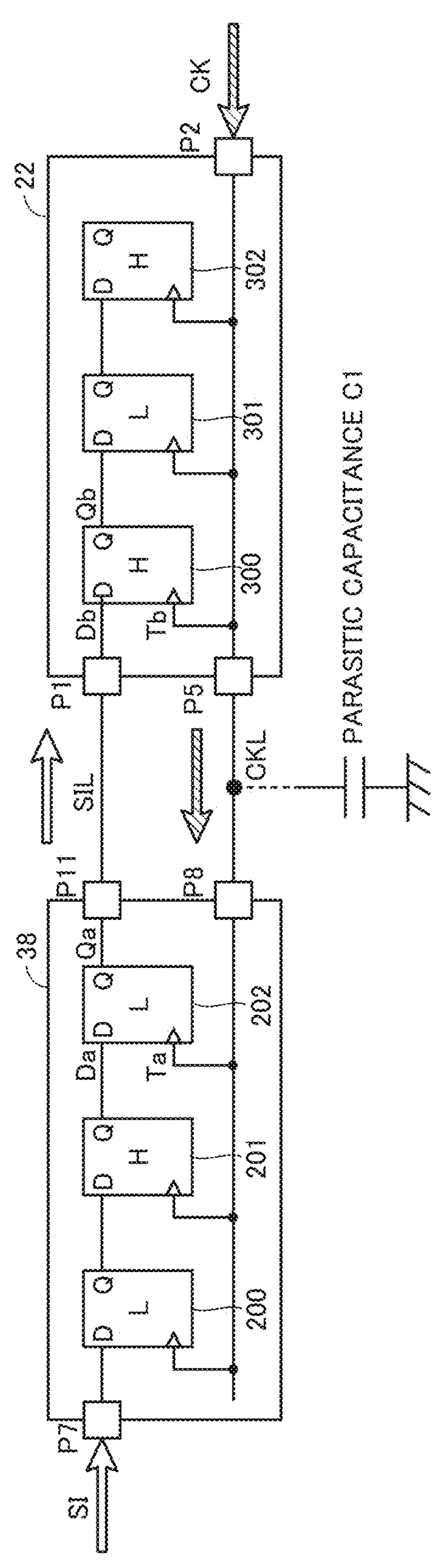
FIG. 8 is a diagram for illustrating a configuration of a shift register unit 22 and shift register unit 38 according to the first embodiment.

FIG. 8 is a diagram for illustrating a configuration of shift register units 22 and 38 according to the first embodiment. Referring to FIG. 8, shift register unit 22 includes a plurality of flip-flops (DT-FFs) 300 to 302. Shift register unit 22 has the plurality of flip-flops (DT-FFs) 300 to 302 cascaded to configure a shift register. Data signal SIL input from input terminal P1 is input to a D input of forefront flip-flop 300, and a Q output of forefront flip-flop 300 is input to a D input of flip-flop 301 of a subsequent stage. A Q output of flip-flop 301 of the subsequent stage is input to a D input of flip-flop 302 of a subsequent stage. Flip-flops 300 to 302 have their Q outputs output to low voltage side set value holding unit 20.

Shift register unit 38 is configured to be similar to that described with reference to FIG. 3, and accordingly, will not be described repeatedly in detail.

Figure 9:
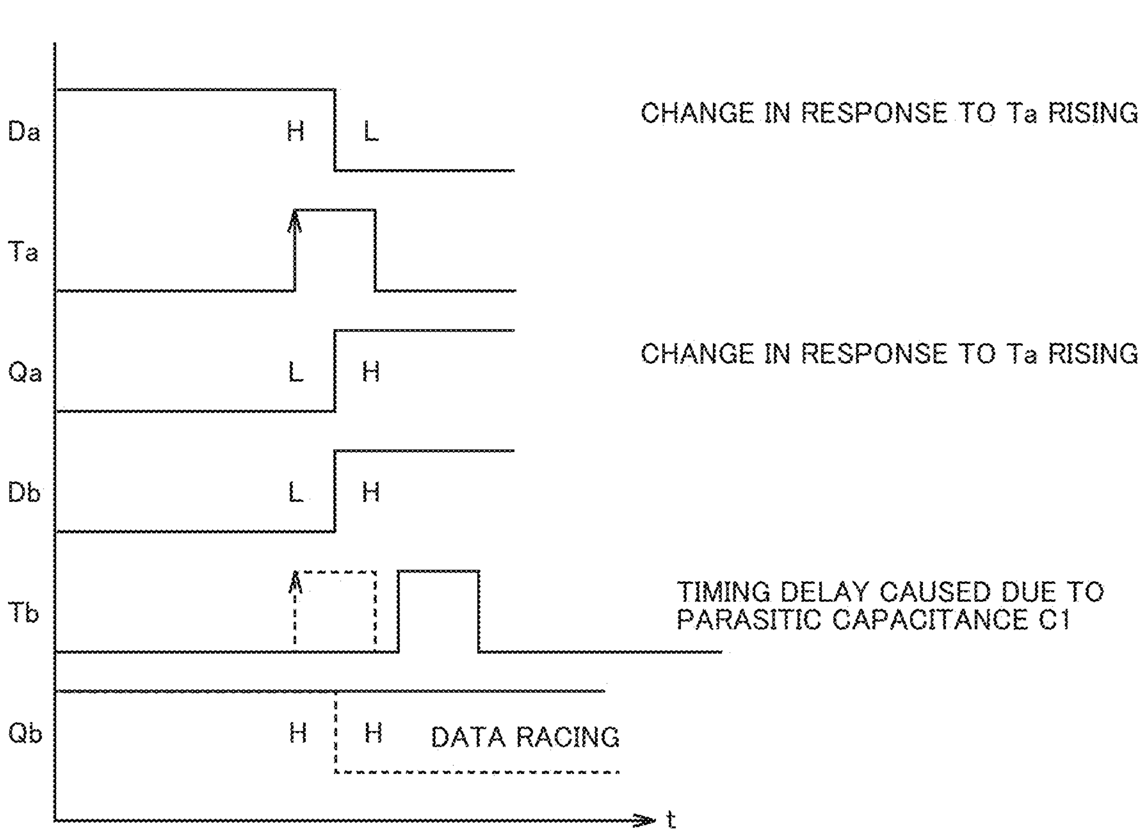
FIG. 9 is a diagram for illustrating shifting data in shift register units 22 and 38 according to a comparative example.

FIG. 9 is a diagram for illustrating shifting data in shift register units 22 and 38 according to a comparative example. Referring to FIG. 9, in this example, a case in which clock signal CK is input on the side of shift register unit 38 will be described.

In this example, flip-flop 202 of shift register unit 38 and flip-flop 300 of shift register unit 22 are noted. A data signal Da, which is an input to flip-flop 202, is stored and held therein in response to a clock signal Ta rising. Accordingly, a data signal Qa, which is an output of flip-flop 202, changes. A data signal Db, which is an input to flip-flop 300, is also stored and held therein in response to a clock signal Tb rising. Accordingly, a data signal Qb, which is an output of flip-flop 300, also changes.

Wiring for a clock signal is provided to be relatively large in length between registers, and there is a possibility that the clock signal may have a timing delay due to an effect of a parasitic capacitance C1.

Specifically, flip-flop 202 holds an output of flip-flop 201, or data signal Da, in response to clock signal Ta rising. In this example, flip-flop 200 has data of the "L" level stored therein. Flip-flop 201 has data of the "H" level stored therein. Flip-flop 202 has data of the "L" level stored therein.

When clock signal Ta rises, flip-flop 202 holds data signal Da (of the "H" level) output from flip-flop 201. Then, an output of flip-flop 202, or data signal Qa, changes from the "L" level to the "H" level. With this change, data signal Db also changes from the "L" level to the "H" level.

In contrast, when the clock signal has no delay, it is expected that flip-flop 300 holds the output of flip-flop 202 or data signal Qa (of the "L" level).

However, when the clock signal is delayed due to parasitic capacitance C1, flip-flop 300 may hold the changed data signal Db in response to the clock signal rising. In that case, data racing occurs, and flip-flop 300 will store data signal Db of the "H" level rather than the "L" level.

That is, in the case of this example, clock signal Tb is delayed due to a timing delay. As a result, data cannot be acquired as appropriately timed, and data racing occurs. As a result, there is a possibility that the data cannot be held accurately.

Figure 10:
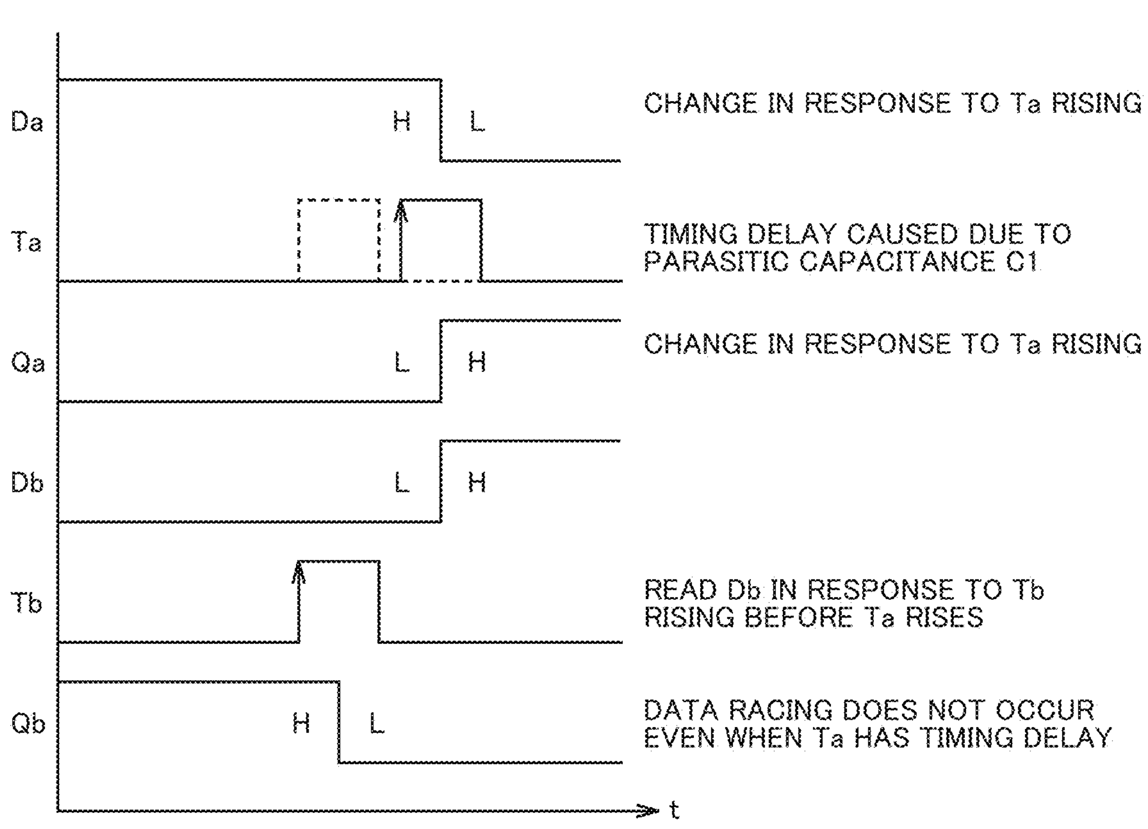
FIG. 10 is a diagram for illustrating shifting data in shift register units 22 and 38 according to the first embodiment.

FIG. 10 is a diagram for illustrating shifting data in shift register units 22 and 38 according to the first embodiment. Referring to FIG. 9, in this example, a case in which clock signal CK is input on the side of shift register unit 22 will be described.

In this example, flip-flop 202 of shift register unit 38 and flip-flop 300 of shift register unit 22 are noted. Specifically, flip-flop 202 holds an output of flip-flop 201, or data signal Da, in response to clock signal Ta rising. In this example, flip-flop 200 has data of the "L" level stored therein. Flip-flop 201 has data of the "H" level stored therein. Flip-flop 202 has data of the "L" level stored therein.

Clock signal Tb is input at terminal P2.

When clock signal Tb rises, flip-flop 300 holds data signal Db (of the "L" level) output from flip-flop 202. Accordingly, the output of flip-flop 300, or data signal Qb, changes to the "L" level.

Subsequently, as has been described above, the clock signal is delayed due to parasitic capacitance C1.

In this example, clock signal Ta rises slightly later than clock signal Tb. Clock signal Ta is input to flip-flops 200 to 202 substantially simultaneously.

Flip-flop 202 captures the output of flip-flop 201, or data signal Da (of the "H" level), in response to clock signal Ta. Accordingly, the output of flip-flop 202, or data signal Qa, is set to the "H" level. Further, together therewith, data signal Db is also set to the "H" level.

Further, flip-flop 201 captures a data signal that is an output from flip-flop 200 in response to clock signal Ta. Thereby, the output of flip-flop 201, or data signal Da, is set to the "L" level.

With this configuration, flip-flops 300 to 302 of shift register unit 22 can hold data, as more appropriately timed by clock signal Tb. Further, flip-flops 200 to 202 of shift register unit 38 can hold data, as more appropriately timed by clock signal Ta delayed.

That is, when clock signal Ta is delayed due to a timing delay, data racing does not occur, and data can be acquired, as appropriately timed, and thus accurately held.

This configuration can suppress data racing in data transfer between registers, and allows a set value to be signaled to set a driving capability and the driving capability to be set to a normal value. That is, the semiconductor module according to the present disclosure allows a driving capability to be normally set while it is miniaturized.

Note that while in this example has been described a configuration in which a data signal is input on the side of shift register unit 38 and a clock signal is input on the side of shift register unit 22, the configuration can also be replaced with a configuration in which the clock signal is input on the side of shift register unit 38 and the data signal is input on the side of shift register unit 22 to implement a similar configuration.

Second Embodiment

Figure 11:
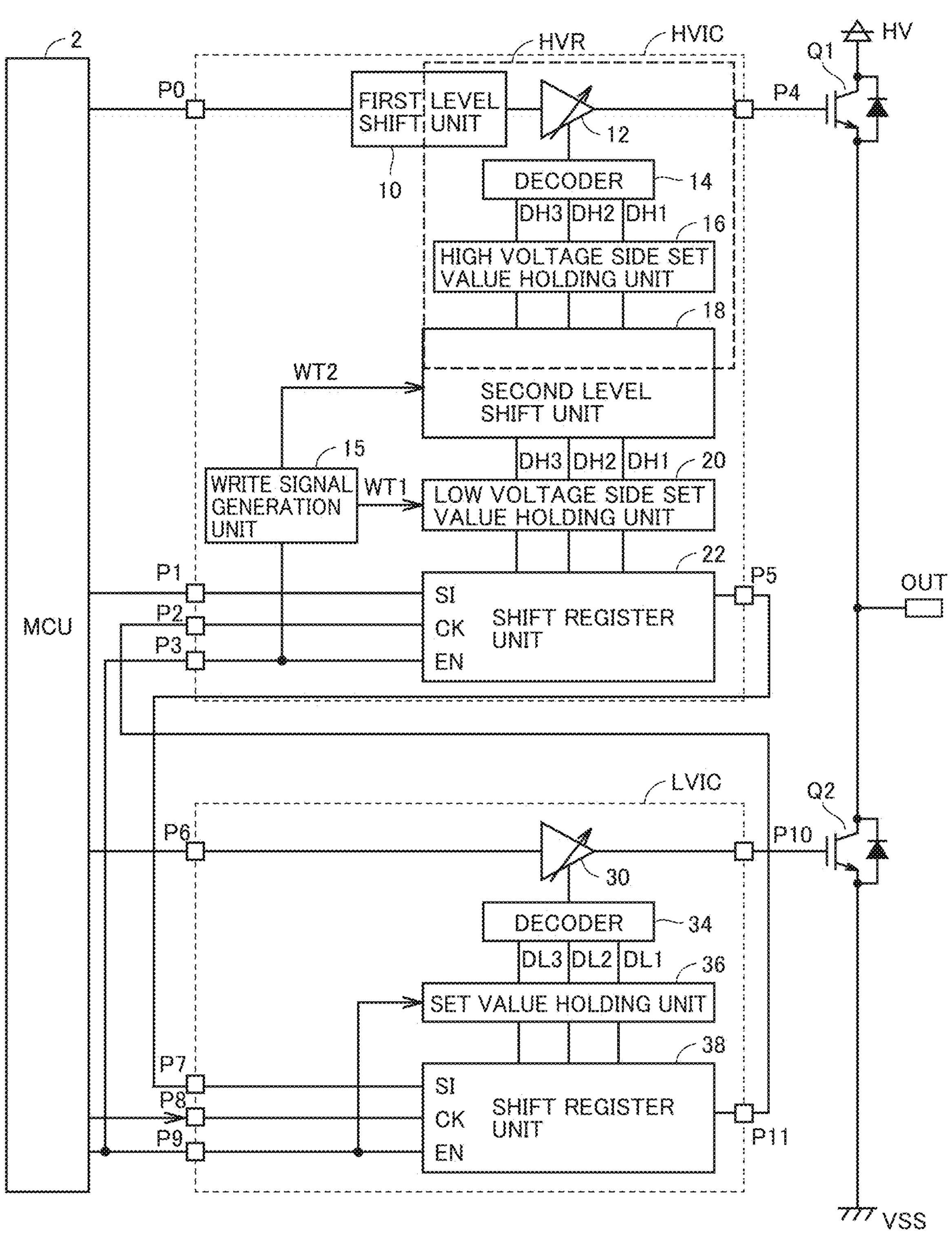
FIG. 11 is a diagram for generally illustrating a configuration of a semiconductor module according to a second embodiment.

FIG. 11 is a diagram for generally illustrating a configuration of a semiconductor module according to a second embodiment. Referring to FIG. 11, the semiconductor module according to the present embodiment differs from the semiconductor module according to the first embodiment in that how shift register units 22 and 38 have their terminals connected is changed. The remainder in configuration is similar to that of the semiconductor module according to the first embodiment, and accordingly, will not be described repeatedly in detail.

High side output capability variable gate device HVIC has input terminals P0 to P3 and output terminals P4 and P5. Input terminal P0 receives high side drive signal HIN from controller 2. Input terminal P1 receives data signal SI from controller 2. Input terminal P2 is connected to output terminal P11 of shift register unit 38 and receives clock signal CKL input. Input terminal P3 receives enable signal EN from controller 2. Output terminal P4 is connected to the gate of power transistor Q1 and outputs high side drive signal HIN level-shifted to a high potential. Output terminal P5 is connected to input terminal P7 and outputs data signal SIL to shift register unit 38.

Low side output capability variable gate device LVIC has input terminals P6 to P9 and output terminals P10 and P11. Input terminal P6 receives low side drive signal LIN from controller 2. Input terminal P7 is connected to output terminal P5 and receives data signal SIL input. Input terminal P8 receives clock signal CK from controller 2. Input terminal P9 receives enable signal EN from controller 2. Output terminal P10 is connected to the gate of power transistor Q2 and outputs the low side drive signal. Output terminal P11 is connected to input terminal P2 and outputs clock signal CKL to shift register unit 22.

This configuration can suppress data racing in data transfer between registers, and allows a set value to be signaled to set a driving capability and the driving capability to be set to a normal value. That is, the semiconductor module according to the present disclosure allows a driving capability to be normally set while it is miniaturized.

The embodiments disclosed herein are also intended to be combined within a consistent scope as appropriate and thus implemented. It should be understood that the embodiments disclosed herein have been described for the purpose of illustration only and in a non-restrictive manner in any respect. The scope of the present disclosure is defined by the terms of the claims, rather than the description above, and is intended to include any modifications within the meaning and scope equivalent to the terms of the claims.

What is claimed is:

1. A semiconductor module comprising:

first and second switching elements connected in series between a first potential and a second potential lower than the first potential and operating in a complementary manner;

a high potential side drive circuit including a first driver connected to a first gate of the first switching element, the high potential side drive circuit being configured to receive an input of a first drive signal and configured to provide a first output to the first gate; and a low potential side drive circuit including a second driver connected to a second gate of the second switching element, the low potential side drive circuit being configured to receive an input of a second drive signal and configured to provide a second output to the second gate, the high potential side drive circuit including:

first reception terminals configured to receive a first data signal, an enable signal, and a first clock signal, respectively;

a first shift register composed of a first plurality of cascaded flip-flops, the first data signal being configured to be recorded in the first plurality of flip-flops in response to the first clock signal and the enable signal, whenever the first data signal is recorded in the first plurality of flip-flops, first data having been recorded in the first plurality of flip-flops being configured to be moved to adjacent flip-flops among the first plurality of flip-flops;

a first set value holding unit operative in response to the enable signal to extract and record contents recorded in the first plurality of flip-flops of the first shift register;

a first decoder configured to cause a first current outputting capability of the first driver to be variable according to the recording of the first set value holding unit; and a first output terminal configured to output the first clock signal to the low potential side drive circuit as a second clock signal, the low potential side drive circuit including:

second reception terminals to receive a second data signal, the enable signal, and the second clock signal, respectively;

a second shift register composed of a second plurality of cascaded flip-flops, the second data signal being configured to be recorded in the second plurality of flip-flops in response to the second clock signal and the enable signal, whenever the second data signal is recorded in the second plurality of flip-flops, second data having been recorded in the second plurality of flip-flops being configured to be moved to adjacent flip-flops among the second plurality of flip-flops;

a second set value holding unit operative in response to the enable signal to extract and record contents recorded in the second plurality of flip-flops of the second shift register;

a second decoder configured to cause a second current outputting capability of the second driver to be variable according to the recording of the second set value holding unit; and a second output terminal configured to output the second data signal that is held in a flip-flop of a last stage of the second shift register to the high potential side drive circuit as the first data signal.

2. The semiconductor module according to claim 1, wherein the second clock signal of the respective second reception terminal that is to receive the second clock signal is configured to be a signal delayed from the first clock signal.

3. The semiconductor module according to claim 1, wherein the high potential side drive circuit further includes a first level shift unit configured to level-shift the first drive signal to a high potential and output the level-shifted first drive signal to the first driver.

4. The semiconductor module according to claim 3, wherein the first set value holding unit includes:

a low voltage side set value holding unit operative in response to the enable signal to extract and record contents recorded in the first plurality of flip-flops of the first shift register;

a second level shift unit configured to level-shift information held in the low voltage side set value holding unit to another high potential; and a high voltage side set value holding unit connected via the second level shift unit to record information identical to the information recorded in the low voltage side set value holding unit.

5. A semiconductor module comprising:

first and second switching elements connected in series between a first potential and a second potential lower than the first potential and operating in a complementary manner;

a high potential side drive circuit including a first driver connected to a first gate of the first switching element, the high potential side drive circuit being configured to receive an input of a first drive signal and configured to provide a first output to the first gate; and a low potential side drive circuit including a second driver connected to a second gate of the second switching element, the low potential side drive circuit being configured to receive an input of a second drive signal and configured to provide a second output to the second gate, the high potential side drive circuit including:

first reception terminals configured to receive a first data signal, an enable signal, and a first clock signal, respectively;

a first shift register composed of a first plurality of cascaded flip-flops, the first data signal being configured to be recorded in the first plurality of flip-flops in response to the first clock signal and the enable signal, whenever the first data signal is recorded in the first plurality of flip-flops, first data having been recorded in the first plurality of flip-flops being configured to be moved to adjacent flip-flops among the first plurality of flip-flops;

a first set value holding unit operative in response to the enable signal to extract and record contents recorded in the first plurality of flip-flops of the first shift register;

a first decoder configured to cause a first current outputting capability of the first driver to be variable according to the recording of the first set value holding unit; and a first output terminal configured to output the first data signal that is held in a flip-flop of a last stage of the first shift register to the low potential side drive circuit as a second data signal, the low potential side drive circuit including:

second reception terminals to receive the second data signal, the enable signal, and a second clock signal, respectively;

a second shift register composed of a second plurality of cascaded flip-flops, the second data signal being configured to be recorded in the second plurality of flip-flops in response to the second clock signal and the enable signal, whenever the second data signal is recorded in the second plurality of flip-flops, second data having been recorded in the second plurality of flip-flops being configured to be moved to adjacent flip-flops among the second plurality of flip-flops;

a second set value holding unit operative in response to the enable signal to extract and record contents recorded in the second plurality of flip-flops of the second shift register;

a second decoder configured to cause a second current outputting capability of the second driver to be variable according to the recording of the second set value holding unit; and a second output terminal configured to output the second clock signal to the high potential side drive circuit as the first clock signal.

* * * * *